(12) United States Patent
Jurewicz et al.

(10) Patent No.: US 9,269,283 B2
(45) Date of Patent: Feb. 23, 2016

(54) DISPLAY DEVICES

(71) Applicant: The Coca-Cola Company, Atlanta, GA (US)

(72) Inventors: William Jefferson Jurewicz, Minneapolis, MN (US); James Allen Squires, Big Lake, MN (US); Barrett David Haroldson, Golden Valley, MN (US); Lawrence Alexander Duarte, Centennial, CO (US); Jeremiah Matthew Hueske, Denver, CO (US); Lo Chi Kwong, Hong Kong (CN); Shawn Roske, Minneapolis, MN (US); Julio Obelleiro, Brooklyn, NY (US)

(73) Assignee: The Coca-Cola Company, Atlanta, GA (US)

( * ) Notice: Subject to any disclaimer, the term of this patent is extended or adjusted under 35 U.S.C. 154(b) by 55 days.

(21) Appl. No.: 14/213,056

(22) Filed: Mar. 14, 2014

(65) Prior Publication Data
US 2014/0259824 A1 Sep. 18, 2014

Related U.S. Application Data

(60) Provisional application No. 61/800,611, filed on Mar. 15, 2013.

(51) Int. Cl.
| G09G 5/10 | (2006.01) |
| G09F 9/00 | (2006.01) |
| G09F 13/00 | (2006.01) |
| G09G 5/02 | (2006.01) |
(Continued)

(52) U.S. Cl.
CPC .............. *G09F 9/00* (2013.01); *G06F 3/04845* (2013.01); *G06F 3/1446* (2013.01); *G06T 3/0093* (2013.01); *G06T 11/60* (2013.01); *G06T 19/00* (2013.01); *G09F 9/3026* (2013.01); *G09F 9/33* (2013.01); *G09F 9/372* (2013.01); *G09F 13/00* (2013.01); *G09F 13/005* (2013.01); *G09G 3/3648* (2013.01); *G09G 5/02* (2013.01); *G09G 5/10* (2013.01); *H05B 33/0842* (2013.01); *H05K 7/00* (2013.01)

(58) Field of Classification Search
None
See application file for complete search history.

(56) References Cited

U.S. PATENT DOCUMENTS

| 4,654,989 A | 4/1987 | Fleming |
| 4,757,626 A | 7/1988 | Weinreich |
(Continued)

FOREIGN PATENT DOCUMENTS

| DE | 10 2009 019 400 A1 | 11/2010 |
| GB | 2 363 506 A | 12/2001 |
(Continued)

OTHER PUBLICATIONS

International Search Report and Written Opinion for PCT/US2014/029573 mailed Sep. 18, 2014.

*Primary Examiner* — Muhammad N Edun
(74) *Attorney, Agent, or Firm* — Merchant & Gould P.C.

(57) ABSTRACT

A display device includes a base structure with a plurality of modules coupled to the base structure. Each of the modules includes a plurality of actuator assemblies, with each of the actuator assemblies being individually controllable to move the actuator assemblies between a retracted state and a plurality of extended states. A controller is coupled to each of the modules. The controller is programmed to control the actuator assemblies to move the actuator assemblies between the retracted state and the plurality of extended states.

20 Claims, 18 Drawing Sheets

(51) Int. Cl.
  *G06T 11/60* (2006.01)
  *G06F 3/0484* (2013.01)
  *G06T 19/00* (2011.01)
  *G09G 3/36* (2006.01)
  *G06T 3/00* (2006.01)
  *H05B 33/08* (2006.01)
  *H05K 7/00* (2006.01)
  *G06F 3/14* (2006.01)
  *G09F 9/302* (2006.01)
  *G09F 9/33* (2006.01)
  *G09F 9/37* (2006.01)

(56) References Cited

U.S. PATENT DOCUMENTS

| | | | |
|---|---|---|---|
| 5,077,608 | A | 12/1991 | Dubner |
| 5,086,287 | A | 2/1992 | Nützel |
| 5,525,000 | A | 6/1996 | Belobraydich et al. |
| 5,717,423 | A | 2/1998 | Parker |
| 5,793,918 | A | 8/1998 | Hogan |
| 5,907,312 | A | 5/1999 | Sato et al. |
| 6,189,246 | B1 | 2/2001 | Gorthala |
| 6,433,761 | B1* | 8/2002 | Remitz ............................ 345/31 |
| 6,462,840 | B1 | 10/2002 | Kravtsov |
| 6,546,655 | B1 | 4/2003 | Hillstrom |
| 6,606,809 | B2 | 8/2003 | Hillstrom et al. |
| 7,055,271 | B2 | 6/2006 | Lutz et al. |
| 7,277,080 | B2 | 10/2007 | Goulthorpe |
| 7,352,339 | B2 | 4/2008 | Morgan et al. |
| 7,356,357 | B2 | 4/2008 | DeCost et al. |
| 7,436,388 | B2 | 10/2008 | Hillis et al. |
| 7,439,950 | B2 | 10/2008 | Carlberg |
| 7,525,510 | B2 | 4/2009 | Beland et al. |
| 7,551,771 | B2 | 6/2009 | England, III |
| 7,552,553 | B2 | 6/2009 | Kelly |
| 7,605,772 | B2 | 10/2009 | Syrstad |
| 7,620,026 | B2 | 11/2009 | Anschutz et al. |
| 7,653,569 | B1 | 1/2010 | Zbib |
| 7,852,333 | B2 | 12/2010 | Nishikawa et al. |
| 7,866,075 | B2 | 1/2011 | Meeker et al. |
| 7,905,413 | B2 | 3/2011 | Knowles et al. |
| 7,928,968 | B2 | 4/2011 | Shon et al. |
| 7,948,450 | B2 | 5/2011 | Kay et al. |
| 8,040,361 | B2 | 10/2011 | Bachelder et al. |
| 8,081,158 | B2 | 12/2011 | Harris |
| 8,152,062 | B2 | 4/2012 | Perrier et al. |
| 8,232,976 | B2 | 7/2012 | Yun et al. |
| 8,254,338 | B2 | 8/2012 | Anschutz et al. |
| 8,289,274 | B2 | 10/2012 | Sliwa et al. |
| 8,413,073 | B2 | 4/2013 | Lee |
| 8,552,883 | B1 | 10/2013 | Su |
| 8,576,212 | B2 | 11/2013 | Lee et al. |
| 8,588,517 | B2 | 11/2013 | Lee et al. |
| 8,606,043 | B2 | 12/2013 | Kwon et al. |
| 2003/0080923 | A1 | 5/2003 | Suyama et al. |
| 2004/0077285 | A1 | 4/2004 | Bonilla et al. |
| 2004/0165006 | A1 | 8/2004 | Kirby et al. |
| 2005/0017977 | A1 | 1/2005 | Simpson et al. |
| 2005/0150147 | A1 | 7/2005 | Berryman |
| 2005/0264430 | A1 | 12/2005 | Zhang et al. |
| 2006/0055641 | A1 | 3/2006 | Robertus et al. |
| 2006/0107567 | A1 | 5/2006 | Liao |
| 2006/0285832 | A1 | 12/2006 | Huang |
| 2007/0171674 | A1* | 7/2007 | Deutsch ........................ 362/612 |
| 2007/0244417 | A1 | 10/2007 | Escriba Nogues |
| 2008/0010041 | A1 | 1/2008 | McDaniel |
| 2008/0115187 | A1 | 5/2008 | Decost et al. |
| 2008/0201208 | A1 | 8/2008 | Tie et al. |
| 2008/0238889 | A1 | 10/2008 | Thorne |
| 2008/0246757 | A1 | 10/2008 | Ito |
| 2008/0266204 | A1 | 10/2008 | Bartels et al. |
| 2009/0084010 | A1 | 4/2009 | Dykstra |
| 2009/0177528 | A1 | 7/2009 | Wu et al. |
| 2009/0184892 | A1 | 7/2009 | Eberle et al. |
| 2010/0182340 | A1 | 7/2010 | Bachelder et al. |
| 2010/0219973 | A1 | 9/2010 | Griffin et al. |
| 2011/0128283 | A1 | 6/2011 | Lee et al. |
| 2011/0175992 | A1 | 7/2011 | Lee et al. |
| 2011/0193277 | A1 | 8/2011 | Christenson |
| 2011/0225860 | A1 | 9/2011 | Troiano et al. |
| 2011/0228058 | A1 | 9/2011 | Hatasawa |
| 2011/0231231 | A1 | 9/2011 | Cruz |
| 2011/0235332 | A1 | 9/2011 | Cheung |
| 2012/0092337 | A1 | 4/2012 | Tsao |
| 2012/0139919 | A1 | 6/2012 | Shintani |
| 2012/0154438 | A1 | 6/2012 | Cohen |
| 2012/0159820 | A1 | 6/2012 | Van Saanen |
| 2012/0188235 | A1 | 7/2012 | Wu et al. |
| 2012/0195463 | A1 | 8/2012 | Shinkai |
| 2012/0224311 | A1 | 9/2012 | Sutherland et al. |
| 2012/0242958 | A1 | 9/2012 | Zuloff |
| 2013/0009951 | A1 | 1/2013 | Kwon et al. |
| 2013/0041730 | A1 | 2/2013 | LoBianco |
| 2013/0063561 | A1 | 3/2013 | Stephan |
| 2013/0117121 | A1 | 5/2013 | Raman et al. |
| 2013/0194059 | A1 | 8/2013 | Parr |
| 2013/0265213 | A1 | 10/2013 | Chen |
| 2013/0312300 | A1 | 11/2013 | Lee |
| 2013/0321394 | A1 | 12/2013 | Fisher et al. |
| 2014/0104389 | A1 | 4/2014 | Dharmatilleke |
| 2014/0114708 | A1 | 4/2014 | Campbell |
| 2014/0267457 | A1 | 9/2014 | Jurewicz et al. |

FOREIGN PATENT DOCUMENTS

| | | |
|---|---|---|
| GB | 2 393 560 | 3/2004 |
| GB | 2 428 433 | 1/2007 |
| GB | 2 435 540 A | 8/2007 |
| JP | 4-14086 | 1/1992 |
| WO | 2005/025377 A1 | 3/2005 |

* cited by examiner

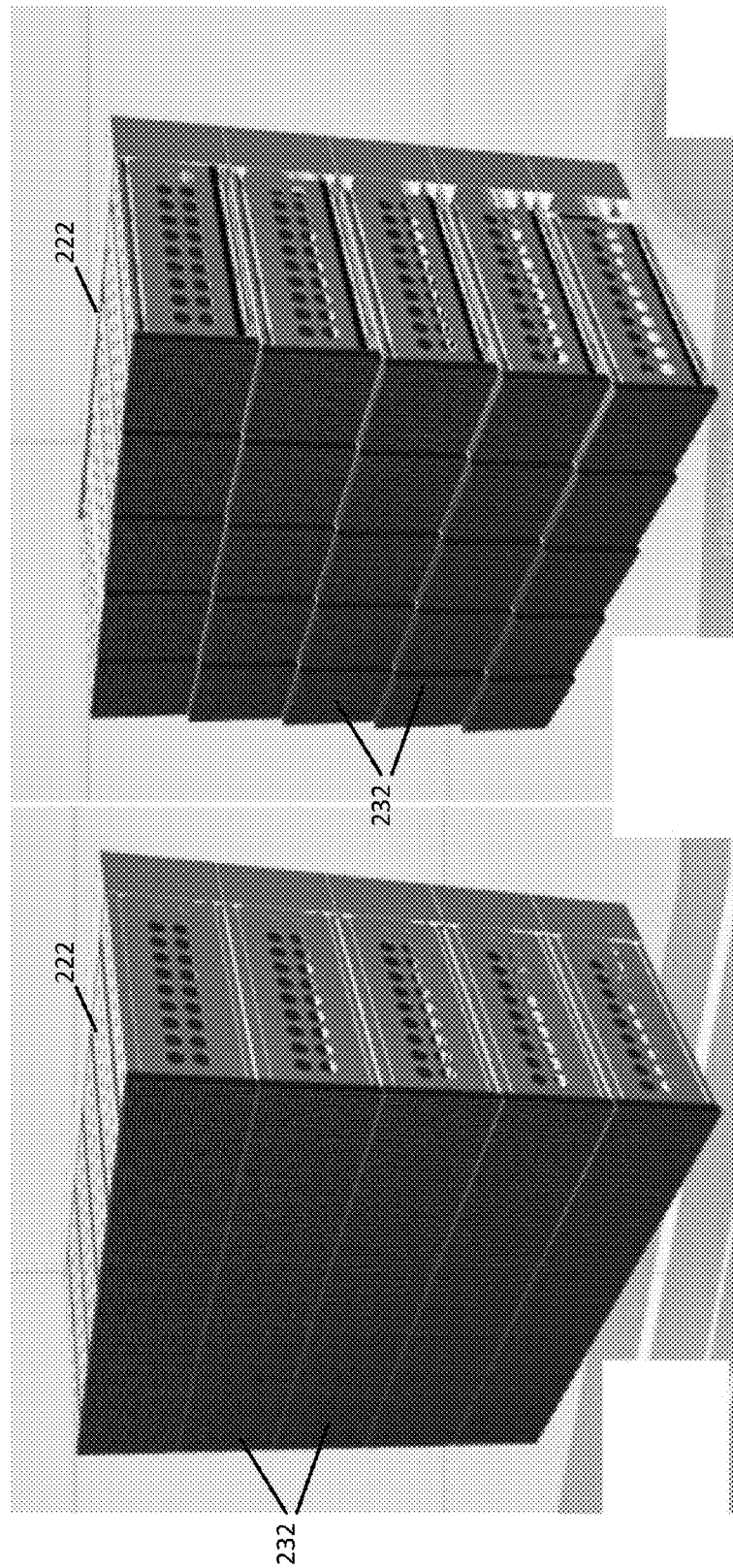

DISPLAY DEVICES

CROSS-REFERENCE TO RELATED APPLICATION

The present application claims the benefit of U.S. Provisional Patent Application Ser. No. 61/800,611, filed Mar. 15, 2013, which application is hereby incorporated by reference in its entirety.

BACKGROUND

Billboards and other large displays are an important component of most advertising portfolios. As with other real estate, location is key. Most displays are configured to catch the eyes of viewers, which can enhance the brands shown on the displays. In crowded display areas, it is important to make a display distinctive to optimize the impact of the display.

DESCRIPTION OF THE DRAWINGS

FIG. 15 is a front perspective view of the support structure and modules of the display device shown in FIG. 2.

FIG. 16 is a rear perspective view of the support structure and modules of FIG. 15.

DETAILED DESCRIPTION

The examples described herein are related to display devices used for advertising.

In some examples, the display devices incorporate lighting and movement. The lighting and movement are configured to catch a viewer's attention. This can enhance the impact of the brand shown on the display device.

Figure 1:
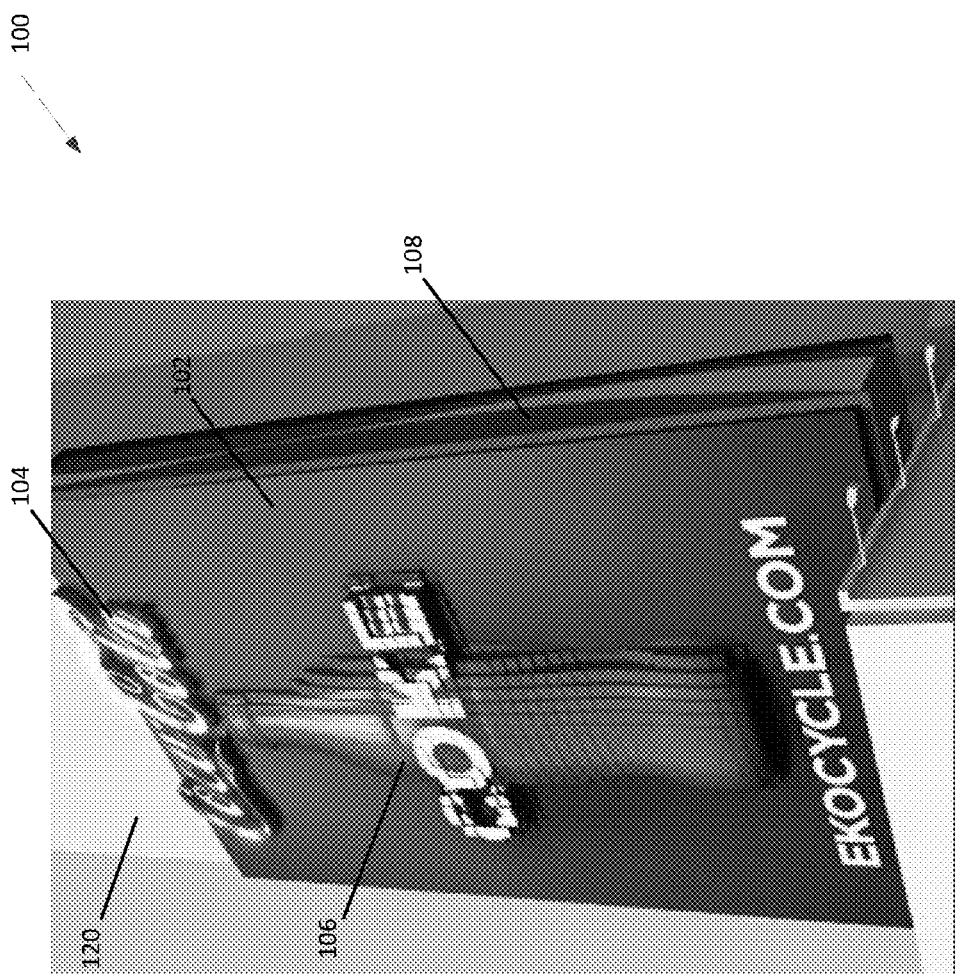
FIG. 1 is a perspective view of an example display device in an example environment.
Figure 2:
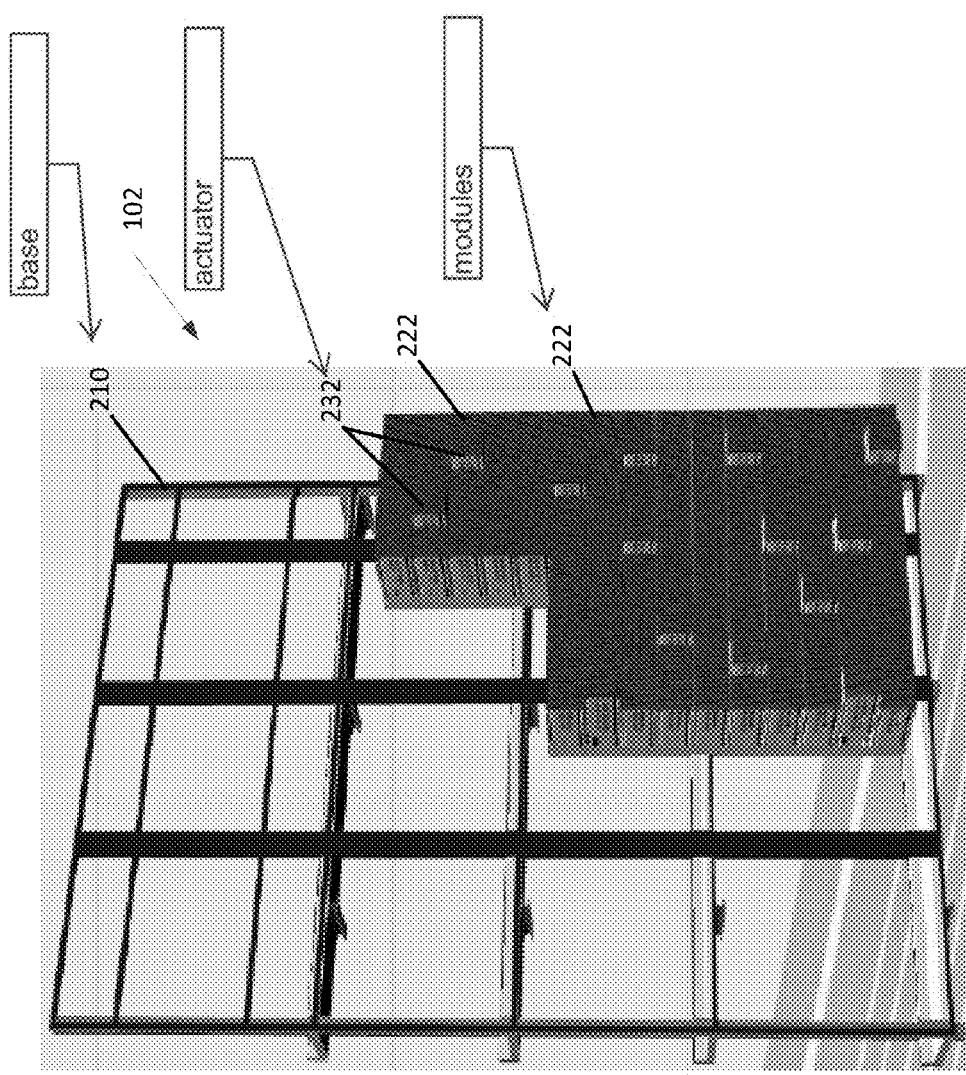
FIG. 2 is a perspective view of an example support structure and modules of the display device shown in FIG. 1.
Figure 3:
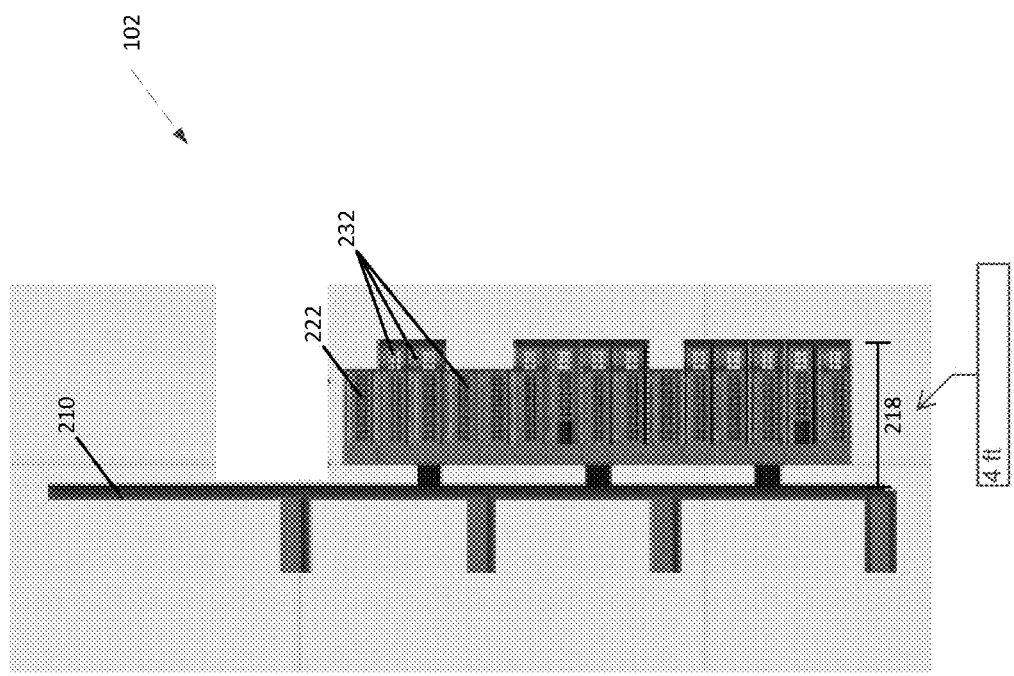
FIG. 3 is a side view of the support structure of FIG. 2.

Referring now to FIG. 1, an example display device 100 is shown. Generally, the display device 100 is mounted on the side 120 of a building. In other examples, the display device 100 can be mounted to other structures, such as a billboard structure, or can be configured to be freestanding.

The display device 100 includes a main display 102 and a side display 108. The main display 102 includes a top channel logo 104 (e.g., the stylized "Coca-Cola") and a dynamic area 106.

The main display 102 and the side display 108 can include lighting to enhance the impact of the display device 100. For example, as described further below, the main display 102 and the side display 108 can include a plurality of elements that are lit. In addition, the dynamic area 106 includes a plurality of actuator assemblies that move.

For example, as shown in FIGS. 2-3 and 15-17, the display device 100 includes a base structure 210 upon which a plurality of modules 222 are mounted. The base structure 210 is mounted to the structure upon which the display device 100 is mounted. The base structure provides structural integrity for each of the modules 222 coupled thereto. The base structure 210 also provides access to each of the modules 222 for service and repair, as described further below.

Each of the modules 222 includes a plurality of actuator assemblies 232 positioned therein. The use of individual modules 222 allows the display device 100 to be installed in an efficient manner, since the modules 222 can be moved and manipulated more easily than the entire display device 100. In this example, the modules 222 extend from the base structure 210 a distance 218 of approximately four feet, although modules of different sizes can be used.

The example depicted shows that each of the modules 222 includes a matrix of five rows of five actuator assemblies 232, for a total of 25 actuator assemblies 232 in each module 222. This configuration allows the actuator assemblies 232 in each of the modules 222 to function as a unit, thereby addressing changes in the environment, including stresses caused by the elements, such as wind, temperature, etc. Because each of the modules 222 functions as a unit, such stresses are accommodated across the actuator assemblies 232.

In alternative designs, the modules 222 can include more or fewer actuator assemblies 232. In the depicted embodiment, some of the actuator assemblies 232 are nonmovable (i.e., stationary), in that the actuator assemblies 232 remain in place and do not move like other actuator assemblies, as described further below.

Figure 4:
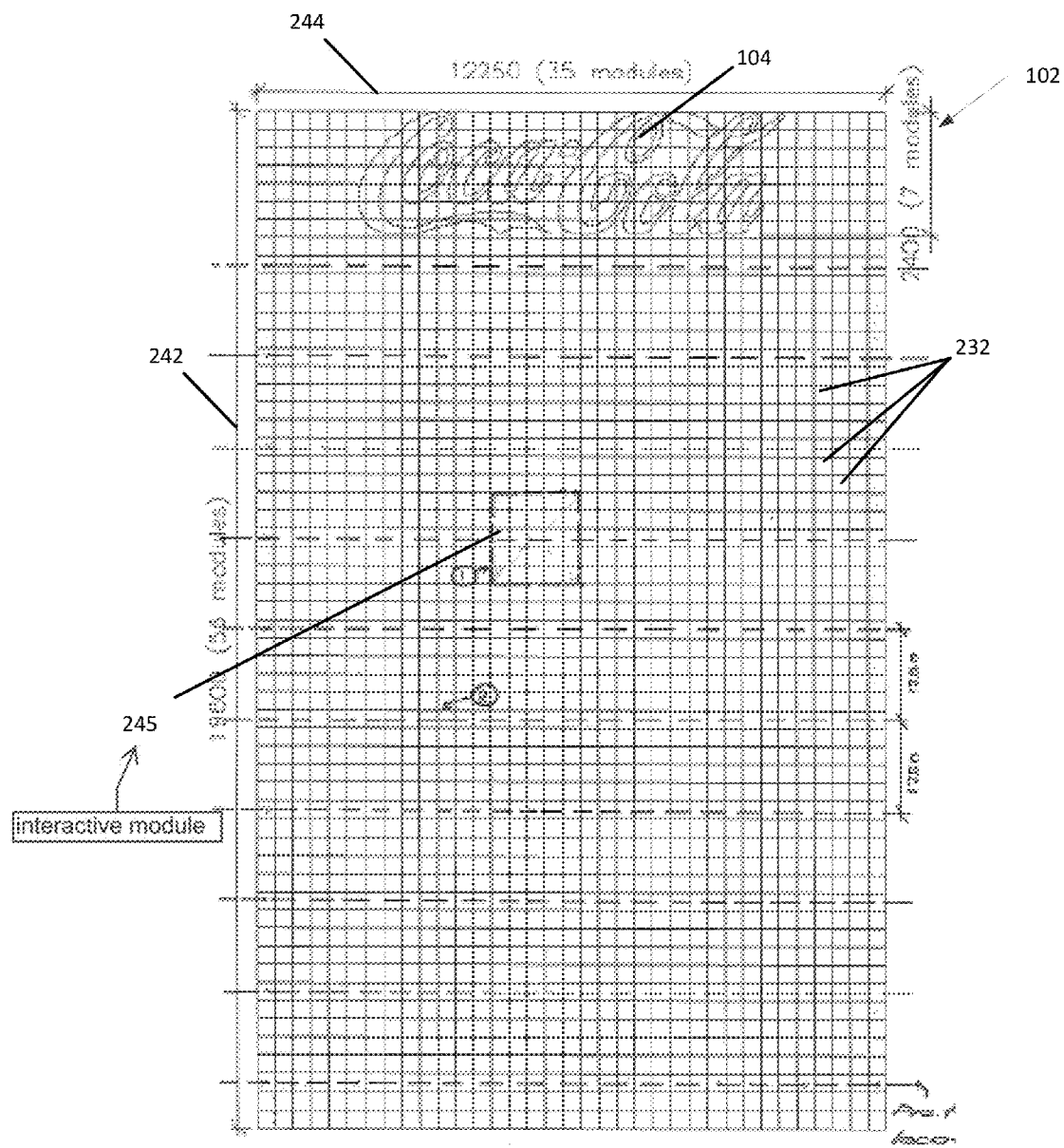
FIG. 4 is a front schematic view of the display device shown in FIG. 1.
Figure 5:
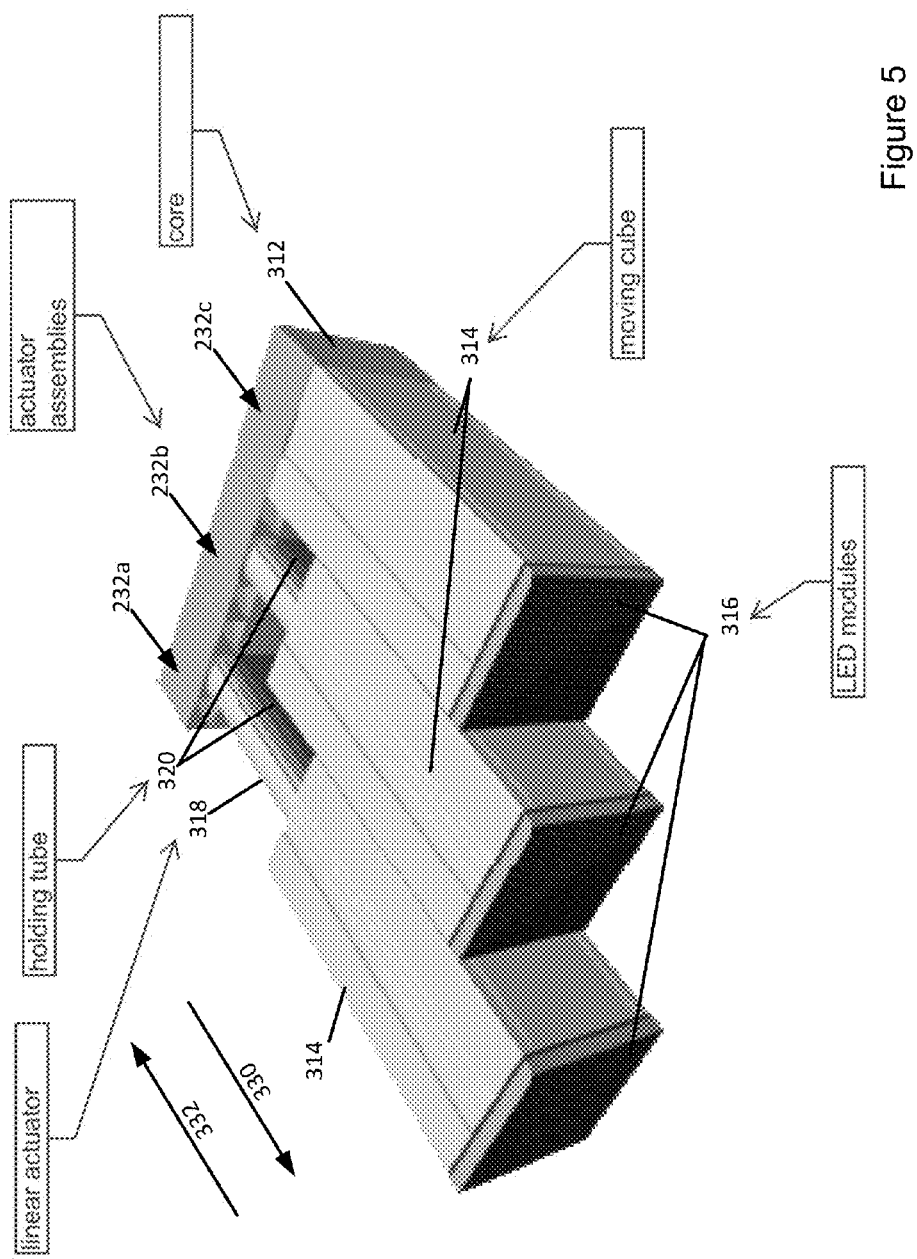
FIG. 5 is a perspective view of example actuator assemblies of the display device shown in FIG. 1.
Figure 6:
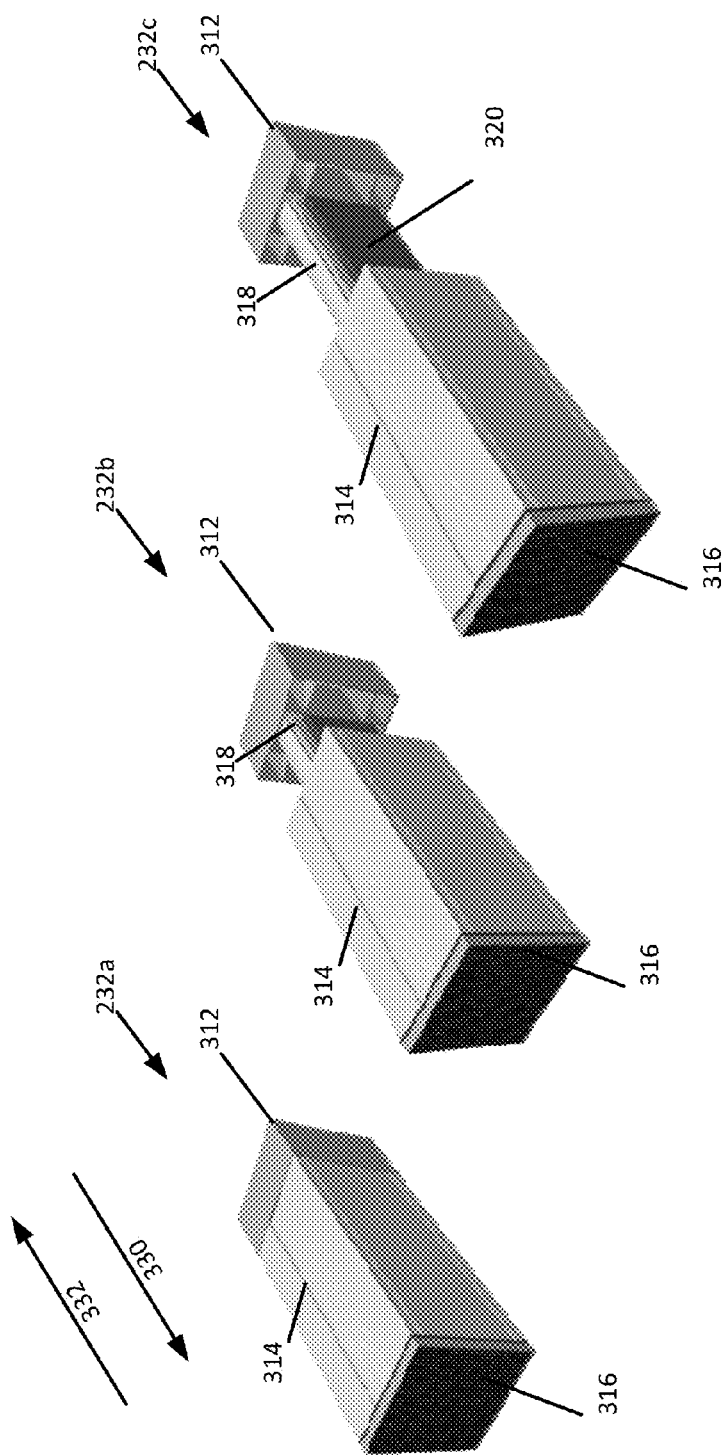
FIG. 6 is another perspective view of the actuator assemblies of FIG. 5.
Figure 7:
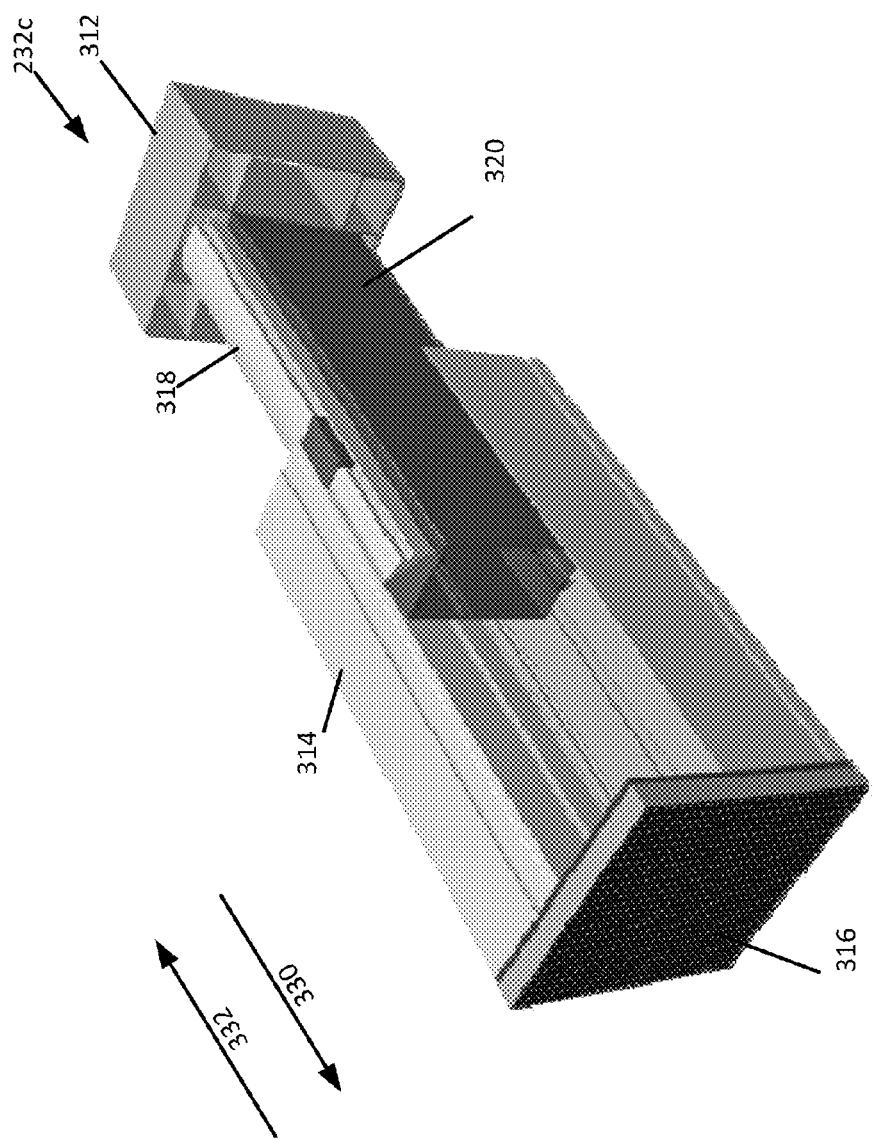
FIG. 7 is a perspective view of a single actuator assembly of FIG. 5.

Referring now to FIG. 4, the main display 102 is shown as made up of a plurality of the modules 222. In this embodiment, a height 242 of the main display 102 is 19.6 meters and a width 244 is 12.25 meters, although displays of other dimensions can be used. In this example, there are approximately 1,960 actuator assemblies 232, of which 1,715 are movable and 245 are nonmovable.

In this example, the main display 102 has a 12.5 millimeter LED pitch size (see FIGS. 18-19), a pixel density of 6,400 pixels per square meter, with a pixel configuration of 1R, 1G, and 1B per pixel. As describe more below, the display has a large viewing angle, 16-bit color processing depth, and is controlled synchronously. Louvers tailored to the specific environment (e.g., based upon the sun density at a particular latitude) can be included to enhance the LED display during sunny conditions. The side display 108 can be similarly configured.

Figure 18:
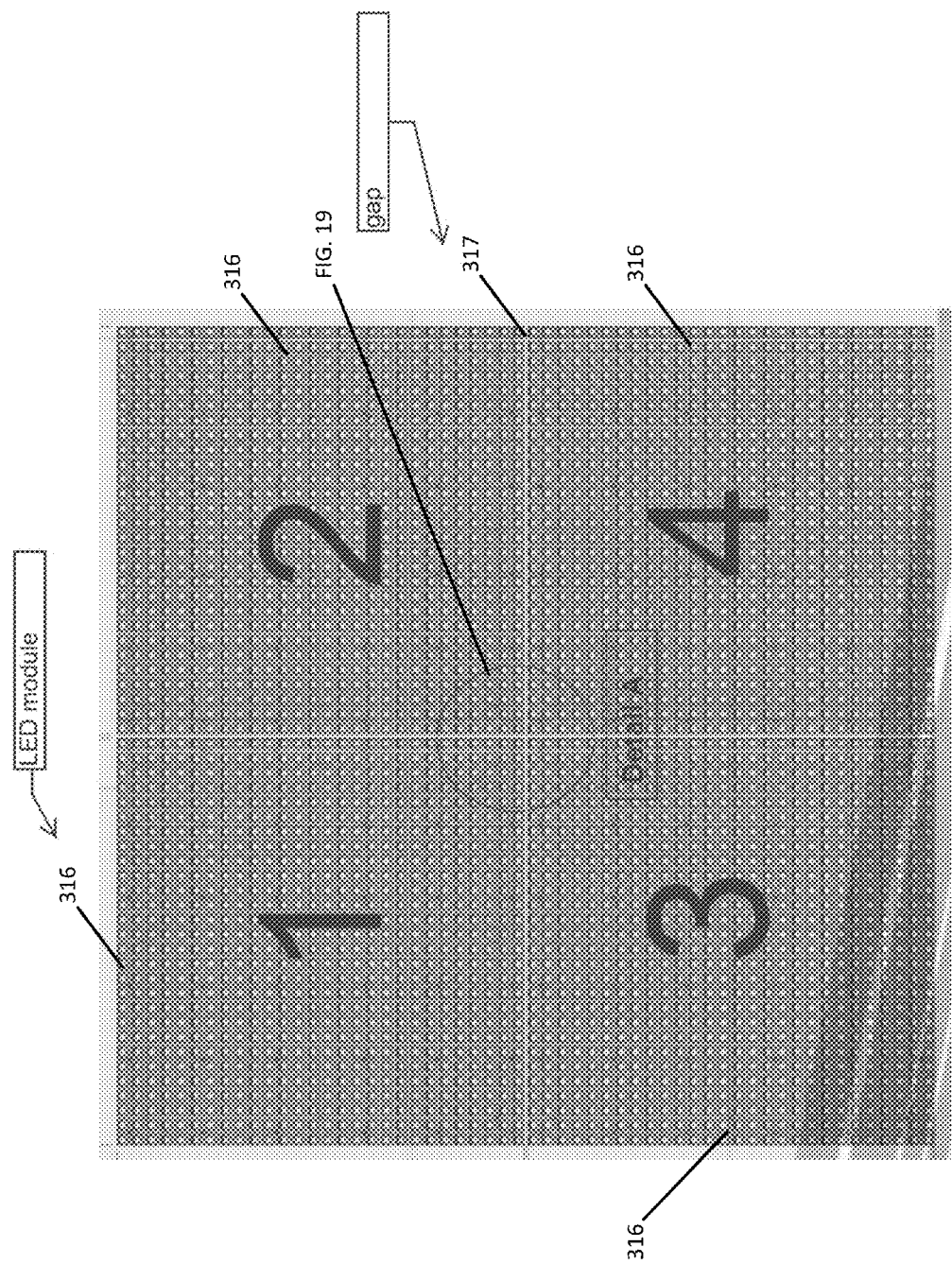
FIG. 18 is a plan view of four LED modules of the display device of FIG. 1.
Figure 19:
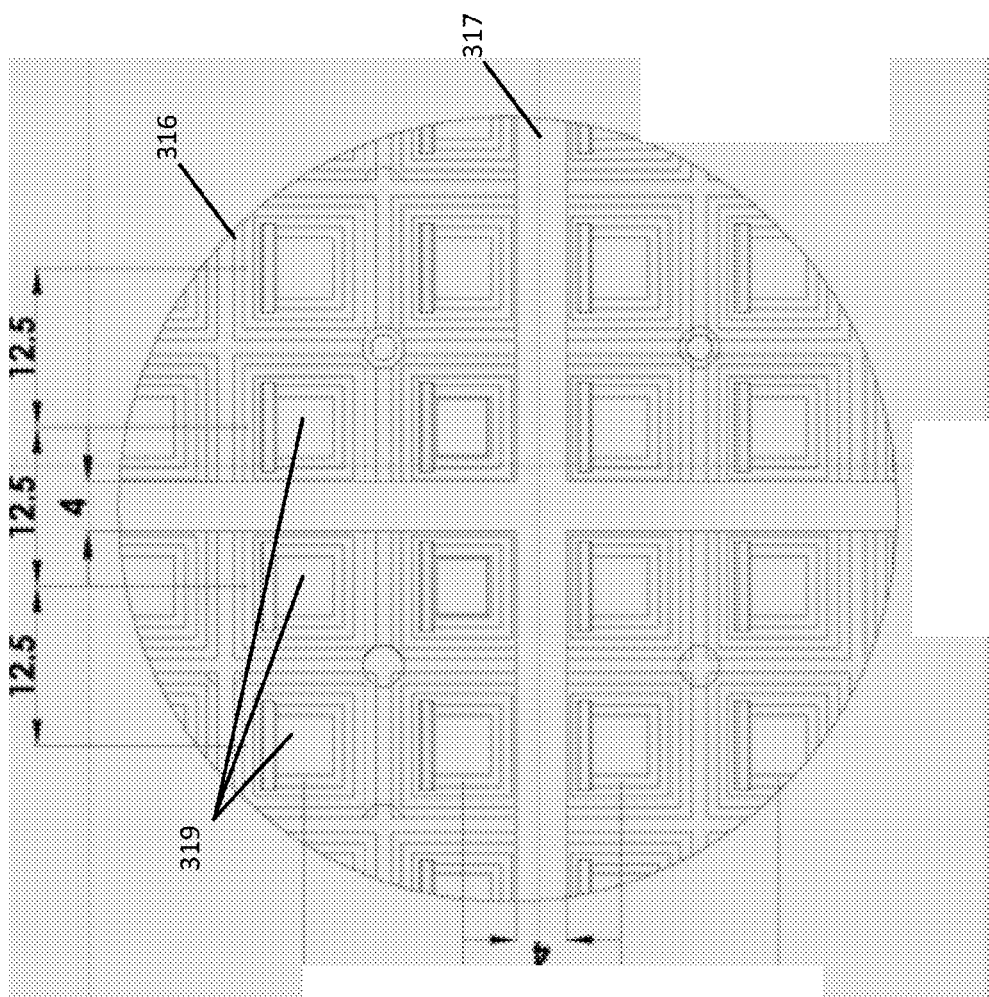
FIG. 19 is an enlarged view of the LED modules of FIG. 18.

For example, FIG. 18 shows four LED modules 316 positioned adjacent to one another. The pitch does not vary between LED modules 316, even with a provided gap, as described further herein.

Referring now to FIGS. 5-10, each of the actuator assemblies 232 is configured to move. Specifically, each of the actuator assemblies 232 includes a moving cube 314 movingly mounted to a core 312. The moving cube 314 is made of a plurality of aluminum extruded panels 314a, 314b, 314c, 314d (see FIG. 10) positioned about a holding tube 320. The moving cube 314 is configured to slide along the holding tube 320 in directions 330, 332.

The moving cube 314 is moved by a linear actuator assembly 318 in the directions 330, 332 in a plurality of extended positions. As depicted, the actuator assembly 232a is fully extended in the direction 330, the actuator assembly 232b is partially extended in the direction 330, and the actuator assembly 232c is fully retracted. In this example, the moving cube 314 moves approximately 20 inches when in the fully extended position, as depicted by the actuator assembly 232a.

Figure 8:
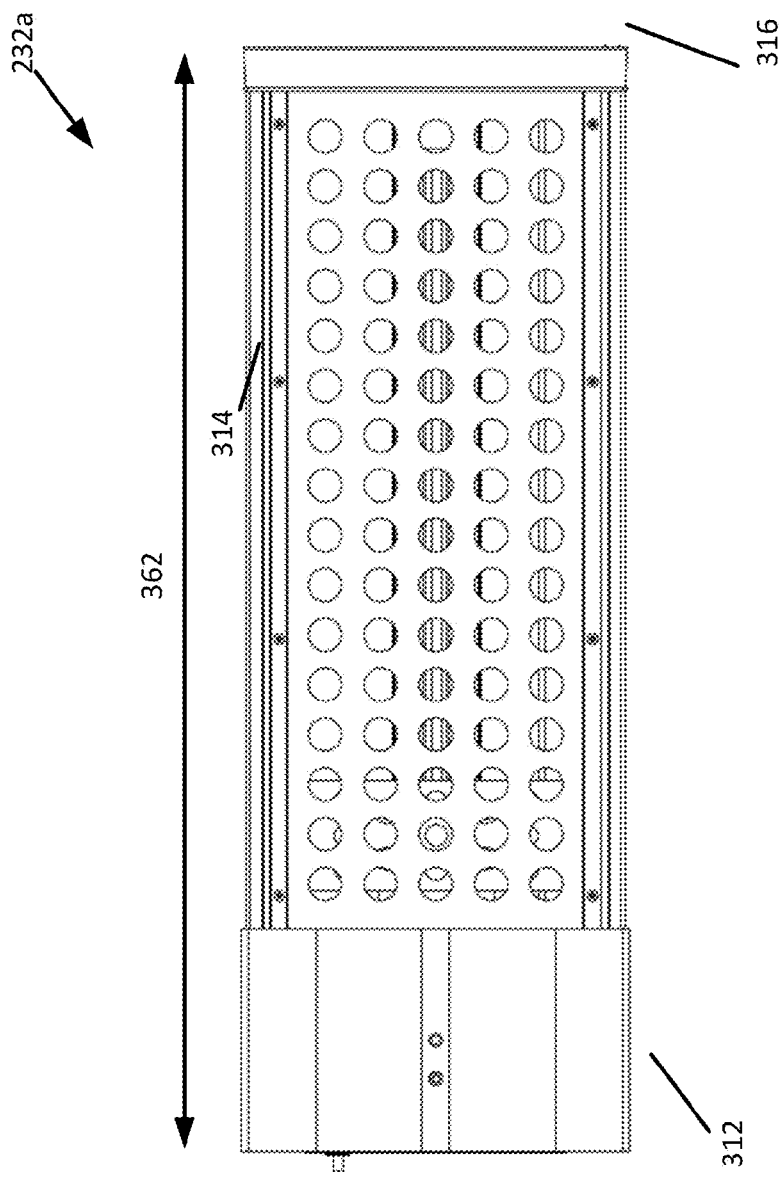
FIG. 8 is a side view of the actuator assembly of FIG. 7 in a retracted state.
Figure 9:
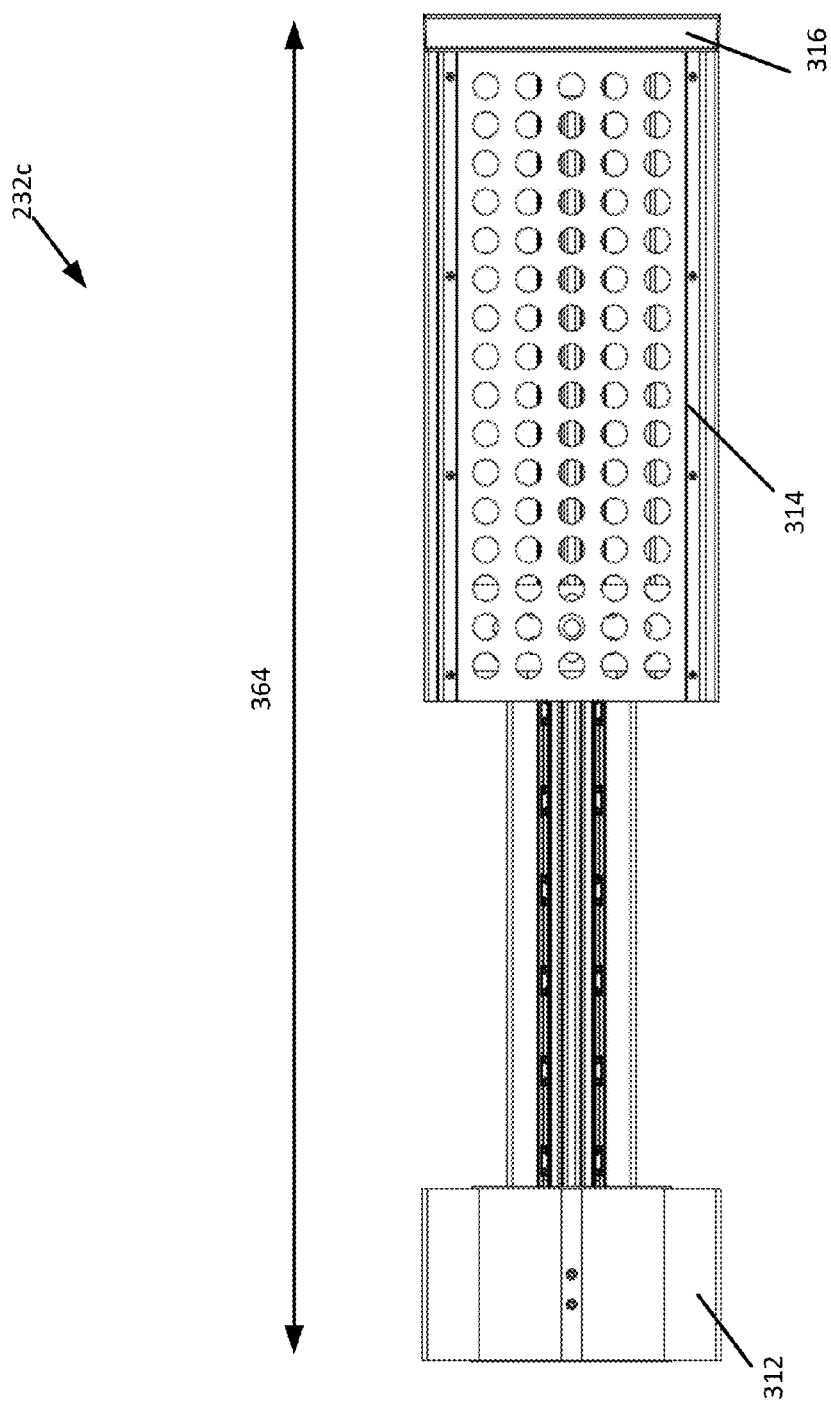
FIG. 9 is a side view of the actuator assembly of FIG. 7 in an expanded state.
Figure 10:
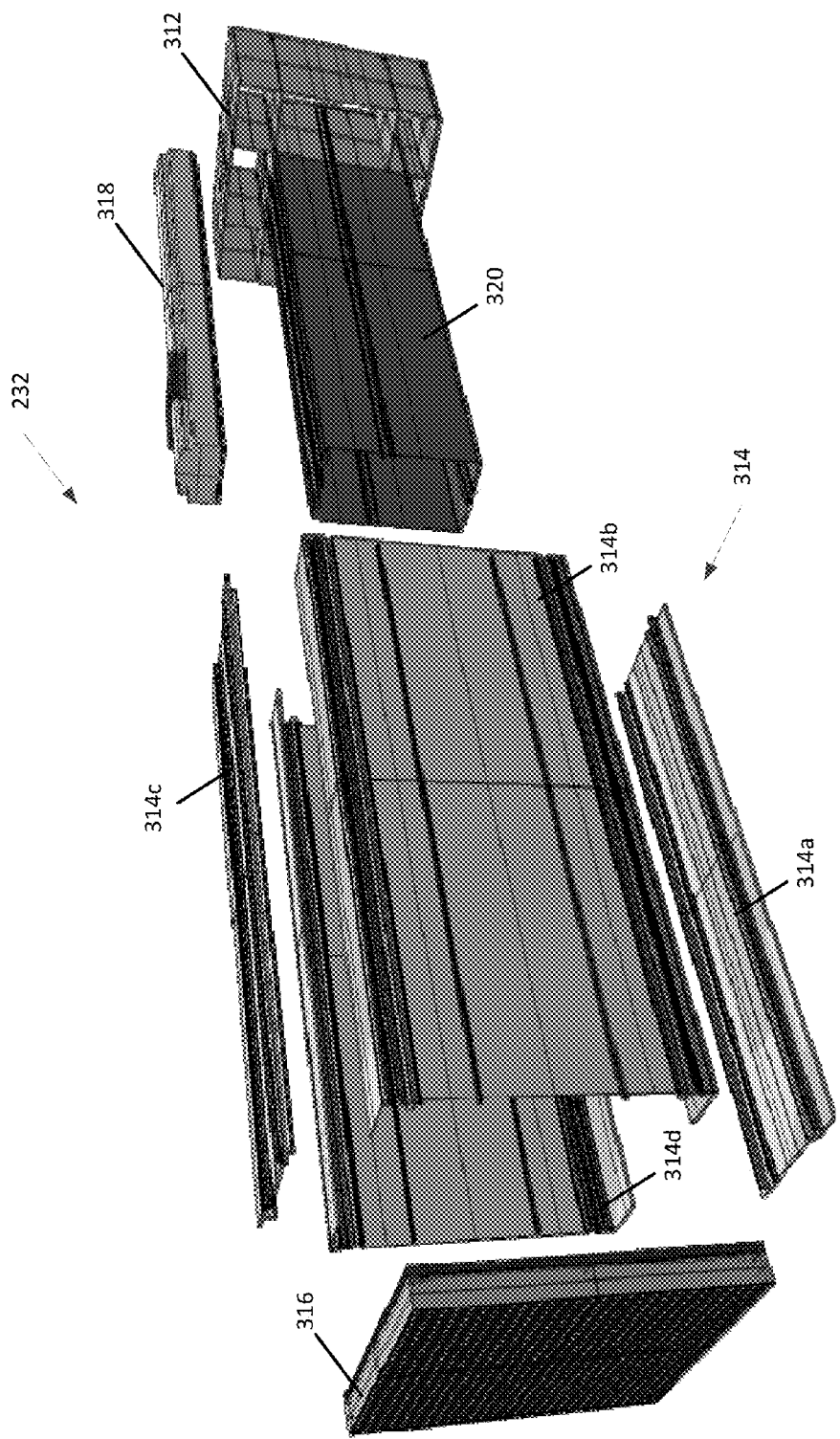
FIG. 10 is an exploded perspective view of the actuator assembly of FIG. 7.

For example, in the full retracted state shown in FIG. 8, the actuator assembly 232a has a length 362 of approximately 1,000 millimeters. In the full expanded state shown in FIG. 9, the actuator assembly 232c has a length 364 of approximately 1,500 millimeters. However, other lengths could be used depending on the amount of movement required. For example, the actuator assembly could be configured such that it extends more than about 20 inches or less than about 20 inches.

In this example, the linear actuator assembly 318 includes a driver with a servo motor. The servo motor is electrically controlled and moves the moving cube 314 in the directions 330, 332 to any of a plurality of extended positions. The movement can be precisely controlled, so that the position of the moving cube 314 is known. For example, in one embodiment, control is as precise as 0.0079 inches, with a position range of 1 to 29,000.

In this example, the linear actuator assembly 318 is a F12-BC made by W-Robit of Taiwan. Such a linear actuator assembly 318 can drive up to 44 pounds, with a maximum drive speed of 40 inches per second. In another example, a PAC-UGT040D actuator made by PBC Linear of Roscoe, Ill., is used. The motor of the linear actuator assembly 318 is a BCH U04 Motor manufactured by Schneider Electric of Palatine, Ill. The motor includes a LXM23A servo driver system and Modicon M258 logic controller, both also manufactured by Schneider Electric. In still other examples, the motor is a SM23165DT motor made by Moog Animatics, of Santa Clara, Calif.

A Light-Emitting Diode (LED) module 316 is mounted to each of the moving cubes 314. The LED module 316 includes a plurality of LEDs, such as an NSSM032T LED module made by Nichia Corporation of Japan. Such an LED module is a 3-in-1 SMD LED, although other types can be used. In this example, the LED module 316 is 346 mm in height by 346 mm in width. The LED module 316 is configured to provide a plurality of colors, and each LED module 316 on each of the actuator assemblies 232 is individually controllable, as described below.

In example embodiments, the LED modules 316 can be configured to display one or a plurality of colors. For example, the LED modules 316 can be configured to display text, pictures, or other effects. By grouping the LED module 316, a larger effect, such as a larger picture or text, can be created on the main display 102.

In other embodiments, LED modules 316 could be placed on the sides (e.g., mounted on panels 314b and 314d), top (314c) and bottom (314a) of the moving cubes 314 near the end of the moving cubes 314. In such an embodiment, the light emitted from the LED modules 316 placed on the side, top and bottom of the moving cubes 314 could be seen when looking at the display device 100 from various angles. This embodiment, for example, would provide more continuous light when two adjacent moving cubes 314 are positioned at different distances and the display 100 is viewed from various angles.

In yet another alternative, the brightness of the lights in the LED modules 316 is configurable to create different appearances. For example, the lights can be dimmed or otherwise dulled to form depth and other visual effects, particularly around the edges of the display device 100.

A gap 317 (see FIGS. 18-19) is provided between each adjacent LED module 316. In one example, this gap 317 is four millimeters. This gap 317 is small enough so that it is indiscernible from the viewing distance for the display device 100. Further, the gap 317 is an air gap, so that any debris or other undesired materials does not get stuck between adjacent LED modules 316. Further, the gap 317 is configured to maintain the 12.5 millimeter pitch between adjacent LEDs 319.

Figure 17:
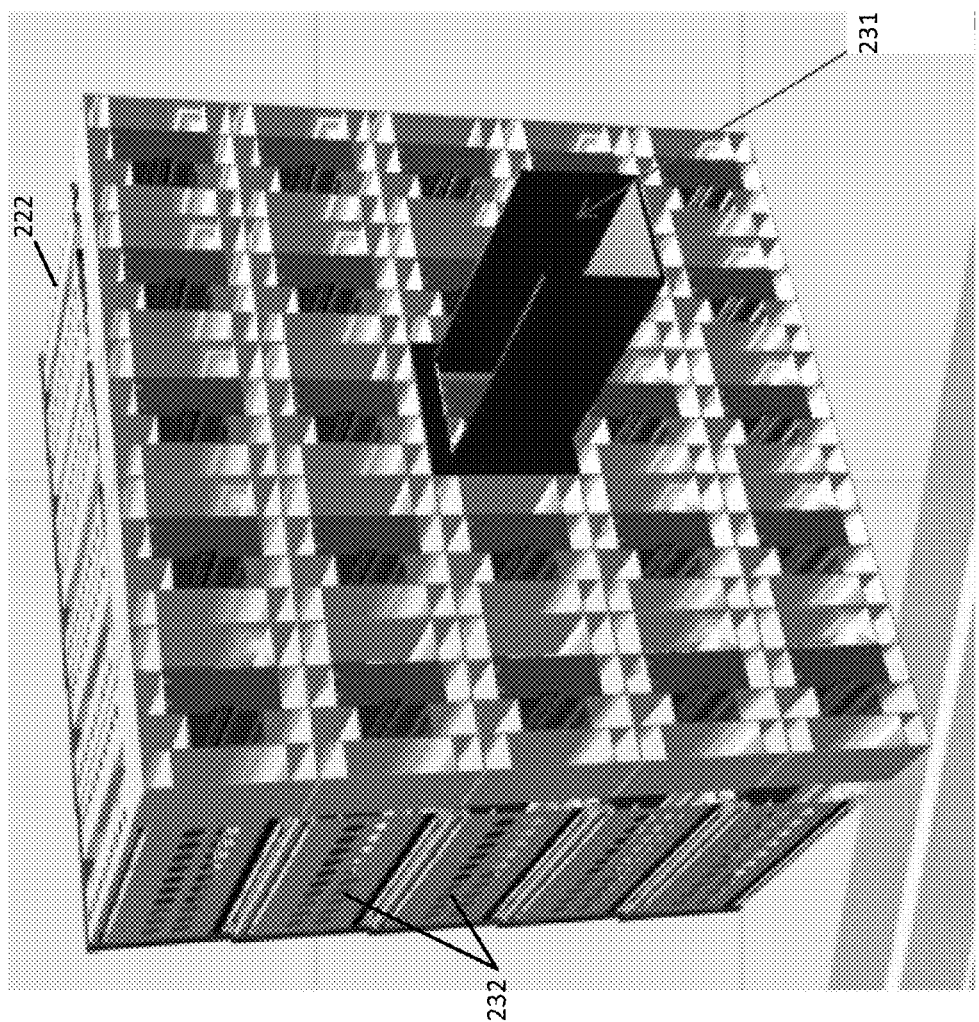
FIG. 17 is another rear perspective view of the support structure and modules of FIG. 16.

In these examples, the construction of the actuator assemblies 232 allows for ease in access and maintenance. Specifically, the way the actuator assemblies 232 are coupled to the modules 222 allows individual actuator assemblies 232 to be removed individually from a rear of the display device 100. For example, FIG. 17 depicts the access of an actuator assembly 232 from a rear of one of the modules 222. Further, each of the actuator assemblies 232 includes an access door 311 (see FIG. 12) on the core 312 that allows access to various components of the actuator assemblies 232 from the rear during service.

Figure 11:
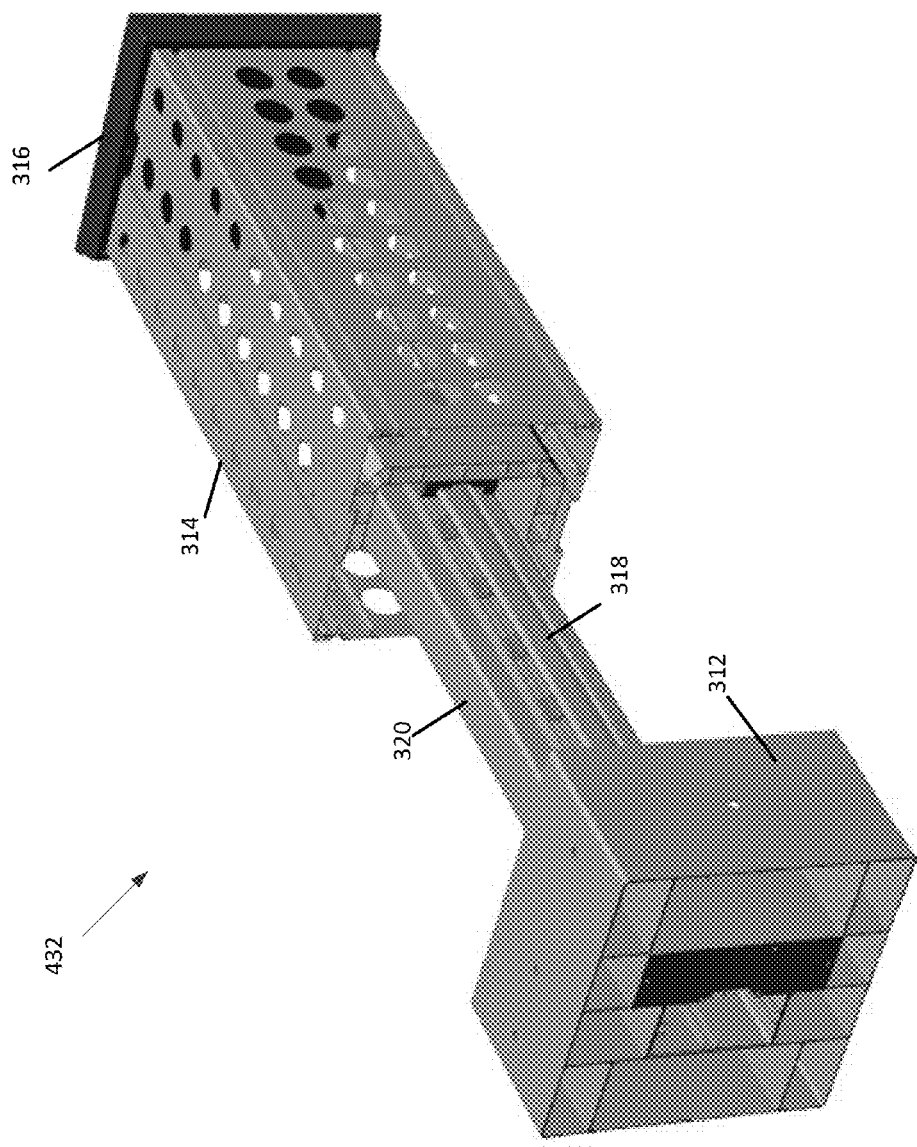
FIG. 11 is a perspective view of another example actuator assembly.
Figure 12:
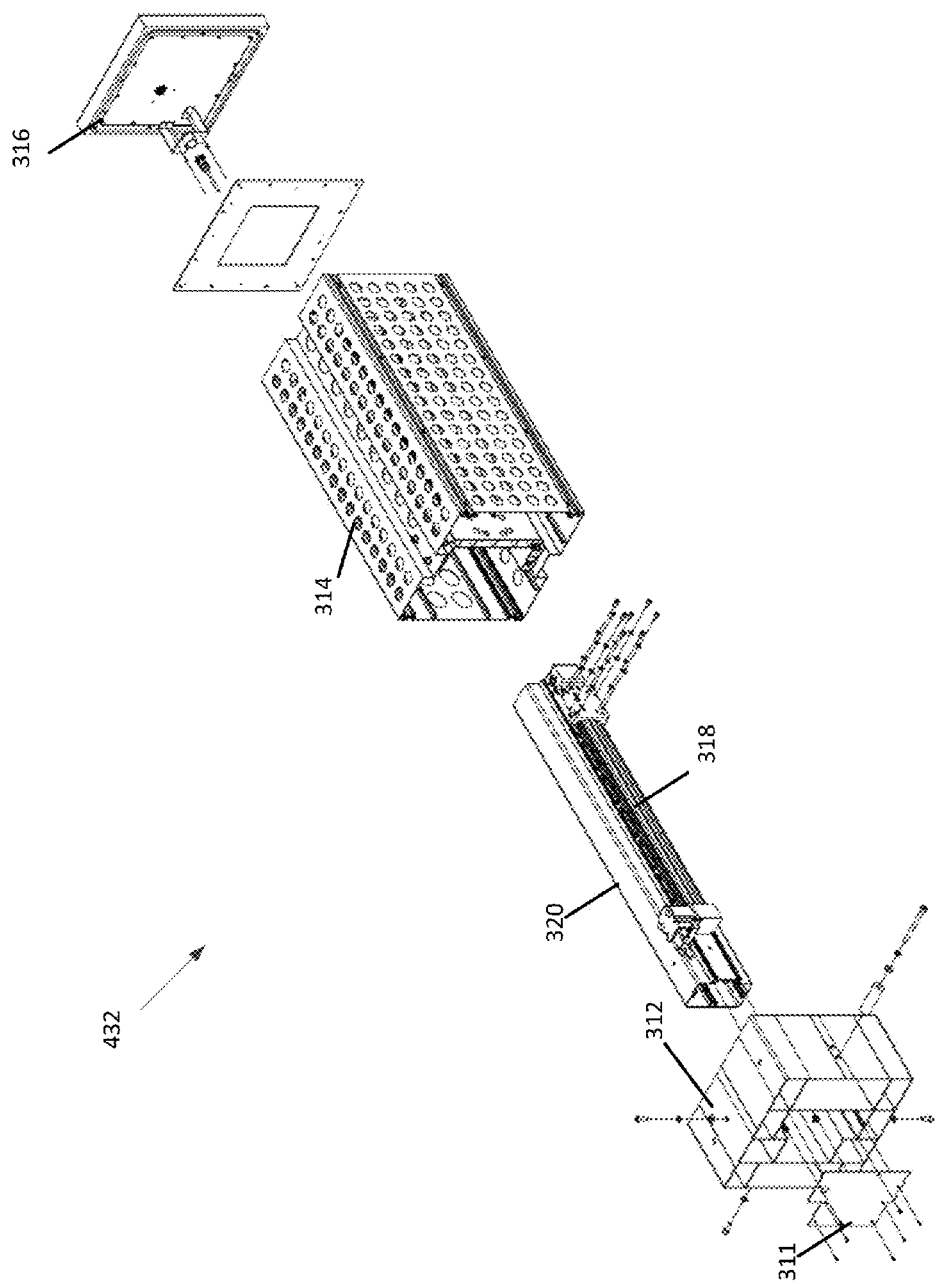
FIG. 12 is an exploded perspective view of the actuator assembly of FIG. 11.

Referring now to FIGS. 11-12, an alternative linear actuator assembly 432 is shown. The actuator assembly 432 is similar to the actuator assembly 232 described above, except that the linear actuator assembly 318 is mounted to a side of the holding tube 320.

The display device 100 may include various other features to obtain and hold the attention of individuals capable of viewing the display device. These features could be facilitated by an interactive module 245 located on the display device 100 or be operably connected to it. For example, the interactive module 245 may include or be operably connected to sensors such as, microphones, cameras, motion detectors, moisture sensors, light sensors, etc. Additional features may include speakers, lasers, or other devices capable of producing light shows, which could also be used to attract and hold the attention of individuals. Such features could be operated separately or may be integrated with other sensors such that the display device 100 choreographs its display depending on input from the various sensors of the interactive module 245. For example, the interactive module 245 can include speakers and lasers controlled by a computing device that can choreograph the various sensors, speakers, or lasers to make the display device more attractive and entertaining In other examples, sensors, such as moisture sensors, can be used to detect certain weather patterns. For example, the sensors can be used to detect certain weather conditions in which operation of the actuator assemblies is not advisable (icing conditions or extreme wind conditions, specifically). In such scenarios, the sensors detect the adverse weather conditions and stop movement of the actuator assemblies until such time as the detected weather state passes.

In other examples, the interactive module 245 is programmed to transmit sound (e.g., music, voice, advertisements) so that passers can tune to a particular radio frequency to listen on their radios. In yet other examples, the interactive module 245 can be programmed to communicate wirelessly (e.g., through Bluetooth or via the Internet) with viewers' smartphones. In this example, the viewer can access content, such as a web site, that allows the viewer to upload or otherwise stream content that can be displayed on the display device 100. Such content could be pictures, etc.

In another example, the interactive module 245 could include microphones such that it could play "live" sound. Such microphones could be directionally focused such that they could focus in on a particular sound source. In this regard the display device could include software such that the display device could be interactive with those viewing the display device's advertisement based on any number of factors such as movement, sound, recognizing elements in its surroundings, etc.

Figure 13:
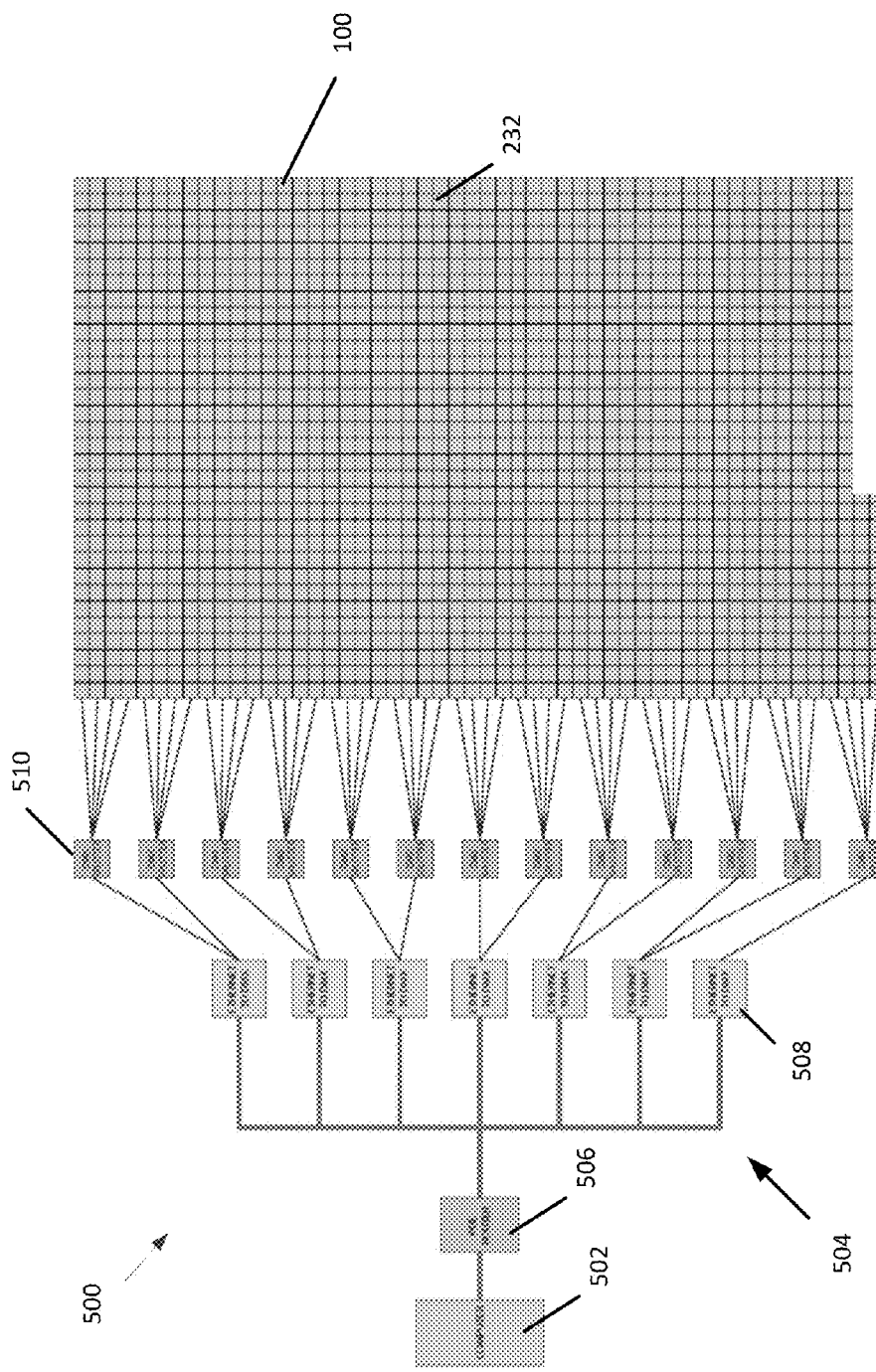
FIG. 13 is a schematic view of an example system for controlling the display device of FIG. 1.

Referring now to FIG. 13, an example system 500 for controlling the display device 100 is shown. In this example, a computing device 502 communicates with each of the actuator assemblies 232 through a network 504. Specifically, the computing device 502 communicates through a router 506 to a plurality of Ethernet to DMX converters 508 which, in turn, communicate with the display device 100 through a plurality of DMX splitters 510. Other configurations are possible.

In this example, the computing device 502 is a local or remote computing device, such as a desktop, laptop, or tablet computer. The computing device 502 can use a standard communication protocol, such as DMX, CANOPEN, Ethernet or RS485 interface, to control the display device 100.

The control by the computing device 502 can include programming the movement of each of the actuator assemblies 232. In one example, an application programming interface (API) is provided that assists in the programming of the movement of the actuator assemblies 232.

In one example, the linear actuator assembly 318 is controlled by the computing device 502 according to a percentage of extension for the moving cube 314. For example, the computing device 502 defines a percentage, such as 0 percent, 10 percent, 25 percent, 50 percent, 75 percent, and/or 100 percent for the moving cube 314 at a given point in time. The logic controller of the linear actuator 318 translates the percentage so that the motor of the linear actuator assembly 318 moves the moving cube 314 the desired amount. By defining a changing percentage over time, the movement of the moving cube 314 can be choreographed, as desired.

In addition, the computing device 502 can define a color to be displayed by the LED module carried by the moving cube 314. The color can be changed to create the desired effect.

Since each of the actuator assemblies 232 can be individually controlled separately, the movement and color of each of the actuator assemblies 232 can be controlled to create patterns or other visual effects for the display device 100.

For example, the actuator assemblies 232 in a certain area of the display can be extended and retracted in coordination to give the appearance of movement of the display device 100. In one such example, the actuator assemblies 232 are controlled to provide a wave-like effect across the display device 100. In another example, the control is randomized, so that the actuator assemblies 232 move in random patterns. Other configurations and patterns are possible.

By controlling the display device 100 in this manner, the overall visual impact of the display device 100 is increased. Specified patterns can be used to further enhance the visual effect of the display device 100, thereby catching the eye of a viewer.

In some examples, the patterns are configured to make certain shapes and depictions. For example, as shown in FIG. 1, the actuator assemblies 232 in the dynamic area 106 are patterned to represent the shape of a Coca-Cola bottle. To accomplish this, each of the actuator assemblies 232 is controlled to extend and/or retract a certain distance to form the pattern of the bottle. An endless number of shapes and depictions can be created in this manner. In addition, the shapes can be used to morph over time into a choreographed series of shapes.

For example, the computing device 502 can be programmed to create various shapes on the display device 100 depending on the time of day, as well as control the sequence of those shapes. The sequence can be choreographed or randomized, as desired. For example, in one embodiment, the computing device 502 can control the sign to depict fluid flowing out of a bottle, to represent the flow of Coke® from a Coca-Cola bottle when it is drunk. Many other examples are possible.

In addition, the computing device 502 may also control other aspects of the display device 100, such as microphones, speakers, cameras or other sensors, such as motion detectors, light sensors, and moisture sensors. For example, the computing device 502 could be configured such that it controls cameras located on or near the display device 100 such that it could display images or video a camera captures. The computing device 502 may also control speakers located on or near the sign such that it can play music or other desired sounds, such as sounds obtained by a microphone. Thus the display device 100 would be able to play stored sound, stream sound from the internet, or also play "live" sound detected by the microphone.

In addition, the computing device 502 may be equipped with video recognition software such that, for example, the camera could recognize a passerby holding a can of Coca-Cola and focus on and display that individual on the display 100. In addition, the computing device may be configured or programed to play stored sounds at relevant times to communicate with, for example, the individual holding the can of Coca-Cola being displayed on the display device 100 by also controlling the speakers to project relevant sounds, slogans, or speech, such as "nice choice" or "enjoy that Coke." In this aspect of one example embodiment, the computing device 502 allows the sign to be interactive with those in its surroundings and drawing more attention to the display device 100.

The computing device 502 may also control other sensors placed on the display, such as for example, motion detectors, light sensors, and moisture sensors. The display device may also include lasers that can be controlled by the computing device 502 such that the display device can produce a laser light show. The computing device may also integrate one or more of the sensors, or the information obtained therefrom, speakers, lasers, etc. to work in combination to enhance the display device 100. In yet another example embodiment of the display 100, the computing device 502 could be connected to the Internet and obtain a variety of information and display it on the display 100, such as weather, news, etc. Such sensors, such as a light sensor, could be used to adjust the brightness of the display device 100, for example, to adjust the brightness of the LEDs depending on the weather or time of day or night. Likewise the microphones could also be used to adjust the volume of the speakers to the appropriate level given the particular surroundings.

Figure 14:
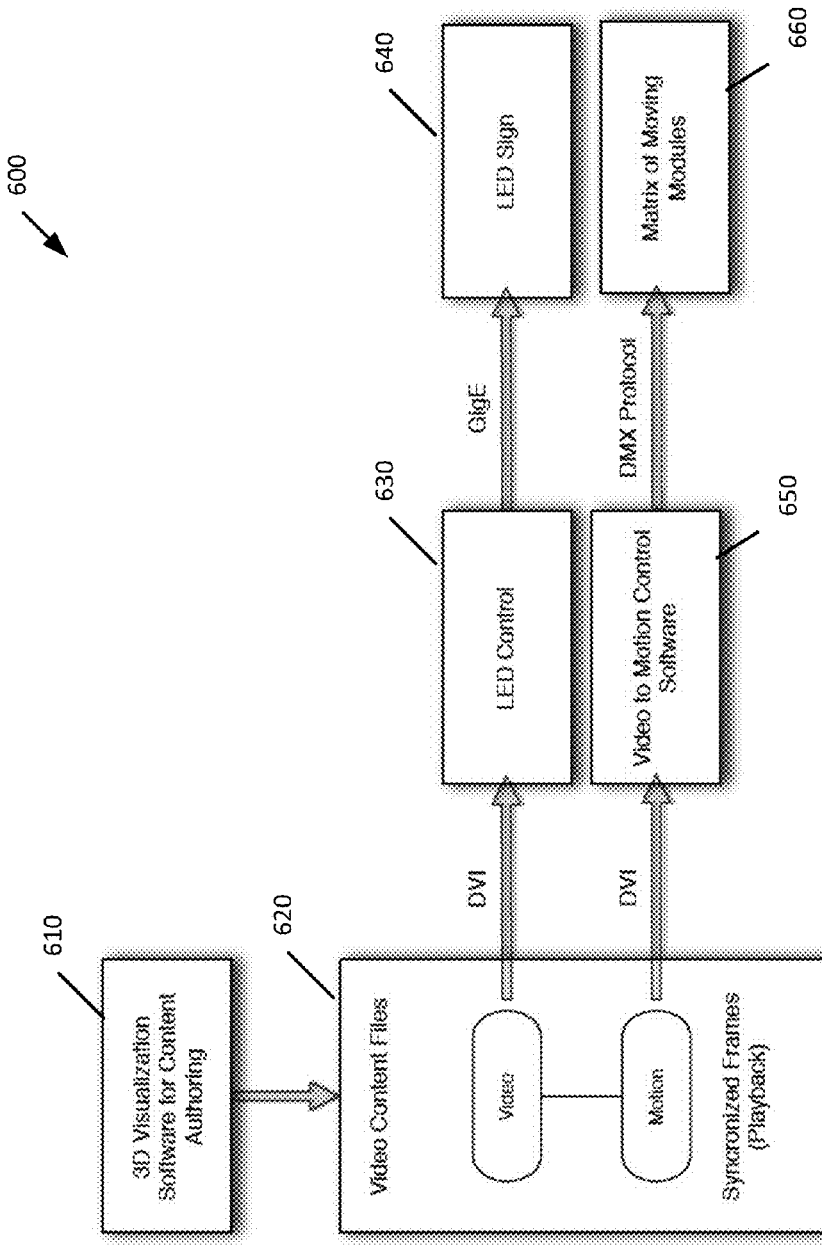
FIG. 14 is a schematic view of an example process for controlling the display device using the system of FIG. 13.

Referring now to FIG. 14, an example process 600 for controlling the display device 100 is shown. Some of the operations in this process 600 can be implemented, for example, by the computing device 502.

At operation 610, three-dimensional visualization software is used to author content for the display device 100. The software, which is executed by the computing device 502 (or any other computing device, not necessarily connected to the display device 100), allows for the creation and/or manipulation of video content that will be used to control the display device 100. The software optionally includes an emulator that depicts the display device 100 to allow a user to author different content for the display device. One example of such content is an advertisement featuring a Coca-Cola bottle. The advertisement can define the shape, motion, and color of the bottle to be depicted on the display device 100.

Next, at operation 620, the content is edited into video (i.e., color) and motion components. This is accomplished by extracting the video and motion components so that dual synchronized video files are formed. The first video file is for controlling the light display (the LED modules), and the second video file is for controlling the motion (i.e., the moving cubes).

The first video file is transferred to operations 630, 640, whereat the LED modules of the display device 100 are controlled. This includes controlling which of the LED modules are active and any content displayed on the LED modules. In this example, the LED modules are controlled using the GigE protocol.

The second video file is transferred to operation 650, whereat the motion file is interpreted and translated into the DMX protocol. This protocol is, in turn, used at operation 660 to control movement of the moving cubes of the actuator assemblies by the servo motor.

By synchronizing the first and second video files, the visual and motion components of the display device 100 are synchronized to create the desired effects as defined by the author.

In these examples, the computing device 502 includes one or more processing units and computer readable media. Computer readable media includes physical memory such as volatile memory (such as RAM), non-volatile memory (such as ROM, flash memory, etc.) or some combination thereof. Additionally, the computing device can include mass storage (removable and/or non-removable) such as a magnetic or optical disks or tape. An operating system, such as Linux or Windows, and one or more application programs can be stored on the mass storage device. The computing device can include input devices (such as a keyboard and mouse) and output devices (such as a monitor and printer).

The computing device also includes network connections to other devices, computers, networks, servers, etc., such as through the network 504. In example embodiments, the computing device communicates with other components through one or more networks, such as a local area network (LAN), a wide area network (WAN), the Internet, or a combination thereof. Communications can be implemented using wired and/or wireless technologies.

The display device 100 is configured to be resistant to the forces of nature. For example, the display device (including the base structure 210 and the modules 222) is configured to withstand rain and wind as the display device 100 is used outside during the different seasons. As noted herein, in certain weather conditions, certain functions of the display device 100 can be suspended temporarily.

The various embodiments described above are provided by way of illustration only and should not be construed to limiting. Those skilled in the art will readily recognize various modifications and changes that may be made to the embodiments described above without departing from the true spirit and scope of the disclosure or the following claims.

What is claimed is:

1. A display device, comprising:
   a base structure;
   a plurality of modules coupled to the base structure, with each one of the plurality of modules including a matrix plurality of actuator assemblies positioned therein, and with each one of the actuator assemblies being individually controllable to move the actuator assemblies between a retracted state and a plurality of extended states; and
   a controller coupled to each one of the plurality of modules, the controller being programmed to control the actuator assemblies to move the actuator assemblies between the retracted state and the plurality of extended states.

2. The display device of claim 1, wherein each of the actuator assemblies includes:
   a stationary core;
   a holding tube coupled to the stationary core;
   a moving cube movably coupled to the holding tube;
   a light module coupled to the moving cube; and
   a linear actuator coupled between the holding tube and the moving cube, the linear actuator being programmed to move the moving cube between the retracted state and the plurality of extended states.

3. The display device of claim 2, wherein the light module includes a plurality of light-emitting diodes.

4. The display device of claim 3, wherein the linear actuator includes a logic controller that is programmed to control a servo driver system, the servo driver system being configured to control a motor that moves the moving cube.

5. The display device of claim 1, wherein the display device includes a main display and a side display.

6. A system for displaying content, the system comprising:
   a display device including:
      a base structure;
      a plurality of modules coupled to the base structure, the base structure defining a plurality of openings for providing rear access to each one of the plurality of modules, with each one of the plurality of modules including a matrix plurality of actuator assemblies positioned therein, and with each one of the actuator assemblies being individually controllable to move the actuator assemblies between a retracted state and a plurality of extended states;
      at least one light module coupled to each one of the plurality of modules;
      a controller coupled to each one of the plurality of modules, the controller being programmed to control the actuator assemblies to move the actuator assemblies between the retracted state and the plurality of extended states; and
   a computing device configured to generate content for the display device, the computing device including:
      memory; and
      a processing unit encoding instructions that, when executed by the processing unit, cause the processing unit to control the actuator assemblies and the light modules.

7. The system of claim 6, wherein each of the actuator assemblies includes:
   a stationary core;
   a holding tube coupled to the stationary core;
   a moving cube movably coupled to the holding tube, wherein the light module is coupled to the moving cube; and
   a linear actuator coupled between the holding tube and the moving cube, the linear actuator being programmed to move the moving cube between the retracted state and the plurality of extended states.

8. The system of claim 7, wherein the light module includes a plurality of light-emitting diodes.

9. The system of claim 7, wherein the linear actuator includes a logic controller that is programmed to control a servo driver system, the servo driver system being configured to control a motor that moves the moving cube.

10. The system of claim 6, wherein the display device includes a main display and a side display.

11. The system of claim 6, wherein the computing device is programmed to generate content for controlling the display device, the content including first content configured to control motion of the actuator assemblies and second content configured to control content displayed by the light modules.

12. The system of claim 11, wherein the first and second content is synchronized.

13. The system of claim 11, wherein the computing device is further programmed to execute a content authoring application configured to generate a three dimensional visualization of the display device.

14. The system of claim 13, wherein the content authoring application is configured to allow a user to author content for display on the display device using the three dimensional visualization of the display device.

15. The system of claim 14, wherein the content is used to generate the first content configured to control motion of the actuator assemblies and the second content configured to control content displayed by the light modules.

16. A method for controlling a display device, the method comprising:
sending a first signal for controlling a plurality of actuator assemblies, the first signal being a first video file that controls the motion of the plurality of actuator assemblies, with each one of the plurality of actuator assemblies being individually controllable to move the plurality of actuator assemblies between a retracted state and a plurality of extended states;
sending a second signal for controlling a plurality of light modules, the second signal being a second video file that controls the content displayed by the plurality of light modules, with at least one of the plurality of light modules being coupled to each one of the plurality of actuator assemblies; and
synchronizing the first and second signals to generate a desired effect on the display device.

17. The method of claim 16, wherein each of the actuator assemblies includes:
a stationary core;
a holding tube coupled to the stationary core;
a moving cube movably coupled to the holding tube, wherein the light module is coupled to the moving cube; and
a linear actuator coupled between the holding tube and the moving cube, the linear actuator being programmed to move the moving cube between the retracted state and the plurality of extended states.

18. The method of claim 16, further comprising:
generating three dimensional content for controlling the display device;
converting a first portion of the three dimensional content into the first signal for controlling motion of the plurality of actuator assemblies; and
converting a second portion of the three dimensional content into the second signal for controlling lighting of the light modules.

19. The method of claim 18, further comprising:
displaying a three dimensional visualization of the display device; and
allowing an author to use the three dimensional visualization to generate the three dimensional content.

20. The method of claim 16, further comprising:
displaying a three dimensional visualization of the display device; and
allowing an author to use the three dimensional visualization to generate three dimensional content; and
using the three dimensional content to control the actuator assemblies and the light modules.

* * * * *